United States Patent
Aleksov et al.

(10) Patent No.: US 12,368,091 B2
(45) Date of Patent: Jul. 22, 2025

(54) PACKAGE SUBSTRATE WITH GLASS CORE HAVING VERTICAL POWER PLANES FOR IMPROVED POWER DELIVERY

(71) Applicant: Intel Corporation, Santa Clara, CA (US)

(72) Inventors: Aleksandar Aleksov, Chandler, AZ (US); Telesphor Kamgaing, Chandler, AZ (US); Veronica Strong, Hillsboro, OR (US); Georgios C. Dogiamis, Chandler, AZ (US); Neelam Prabhu Gaunkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 826 days.

(21) Appl. No.: 17/349,697

(22) Filed: Jun. 16, 2021

(65) Prior Publication Data

US 2022/0406696 A1  Dec. 22, 2022

(51) Int. Cl.
| | | |
|---|---|---|
| *H01L 23/498* | (2006.01) | |
| *H01L 21/48* | (2006.01) | |
| *H01L 23/00* | (2006.01) | |
| *H01L 23/15* | (2006.01) | |

(52) U.S. Cl.
CPC .... *H01L 23/49822* (2013.01); *H01L 21/4857* (2013.01); *H01L 21/486* (2013.01); *H01L 23/15* (2013.01); *H01L 23/49838* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 9,905,527 B1* | 2/2018 | Hacker | H01L 24/11 |
| 10,541,143 B2 | 1/2020 | Guler et al. | |
| 2011/0133342 A1 | 6/2011 | Arai | |
| 2012/0153495 A1 | 6/2012 | Mallik | |
| 2015/0147834 A1* | 5/2015 | Yu | H01L 33/62 438/28 |
| 2016/0155694 A1* | 6/2016 | Mallik | H01L 23/49838 174/262 |
| 2018/0358292 A1 | 12/2018 | Kong et al. | |
| 2019/0006264 A1 | 1/2019 | Vaidya | |
| 2019/0306988 A1 | 10/2019 | Grober et al. | |
| 2022/0238480 A1* | 7/2022 | Zhan | H01L 24/16 |

OTHER PUBLICATIONS

Search Report and Written Opinion for Netherlands Patent Application No. 2031856 mailed Feb. 28, 2023, 10 pgs., partial English translation.
International Search Report and Written Opinion for International Patent Application No. PCT/US2022/021728 mailed Jul. 8, 2022, 11 pgs.

* cited by examiner

*Primary Examiner* — Hung K Vu
(74) *Attorney, Agent, or Firm* — Schwabe, Williamson & Wyatt, P.C.

(57) ABSTRACT

Embodiments disclosed herein include package substrates and methods of forming such package substrates. In an embodiment the package substrate comprises a core and buildup layers on the core. In an embodiment, first level interconnect (FLI) pads are on a topmost buildup layer, and the FLI pads have a pitch. In an embodiment, a plurality of vertically oriented planes are embedded in the core, and the vertically oriented planes are spaced at the pitch.

25 Claims, 11 Drawing Sheets

PACKAGE SUBSTRATE WITH GLASS CORE HAVING VERTICAL POWER PLANES FOR IMPROVED POWER DELIVERY

TECHNICAL FIELD

Embodiments of the present disclosure relate to electronic packages, and more particularly to package substrates with a glass core with vertical power planes for improved power delivery.

BACKGROUND

Power delivery is a critical function for any package substrate. Reducing the power losses in the package is critical to improve power delivery performance. One such loss is ohmic losses that are due to the actual ohmic resistance of the power delivery network. Almost all substrate package layers contribute to the power delivery network by incorporating power planes or power traces. In the case of cored packages (e.g., glass fiber reinforced cores), power delivery must be routed through plated through holes (PTHs). PTHs have large pitches. This limits how fine grained the power delivery can be, and requires additional routing. The additional routing adds to the resistance of the power delivery network, and is therefore, undesirable.

EMBODIMENTS OF THE PRESENT DISCLOSURE

Described herein are package substrates with a glass core with vertical power planes for improved power delivery, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
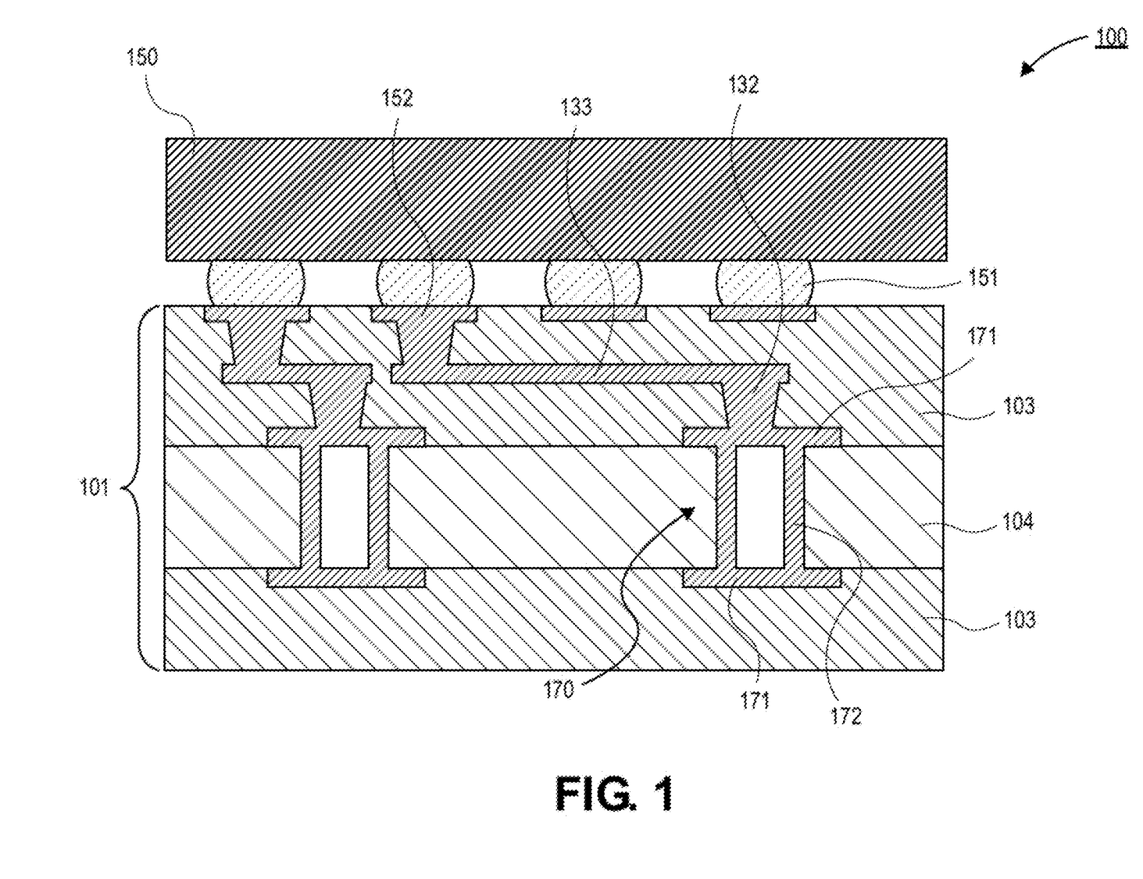
FIG. 1 is a cross-sectional illustration of a package substrate with a plated through hole (PTH) for power delivery.

As noted above, power delivery networks in existing packages require plated through holes (PTHs) in order to provide routing through package cores (e.g., glass fiber reinforced cores). An example of such a power delivery network is shown in FIG. 1. As shown, the package substrate 101 comprises a core 104 (e.g., a glass fiber reinforced core) and buildup layers 103 over and under the core 104. A die 150 is coupled to pads 152 on the package substrate 101 by first level interconnects (FLIs) 151. In order to provide routing through the core 104, PTHs 170 are used. The PTHs 170 include a pad 171 over the core 104 and a conductive shell 172 that passes through the thickness of the core 104. The opening through the core 104 is typically formed with a mechanical drilling process. The use of mechanical drilling requires large feature sizes and large pitches between neighboring PTHs 170. For example, the PTHs 170 in FIG. 1 have a much larger pitch than the FLI pads 152. Accordingly, lateral routing in the buildup layers 103 is needed in order to electrically couple together a PTH 170 and the corresponding FLI pad 152. As shown, a via 132 and a lateral trace 133 are needed to connect the rightmost PTH 170 to the corresponding FLI pad 152. The additional lateral routing increases the ohmic resistance and results in losses in the power delivery network.

Accordingly, embodiments disclosed herein use laser-assisted etching processes to enable the formation of vertically oriented planes through the core. The vertically oriented planes provide several benefits compared to the existing PTH architectures. For one, the laser-assisted etching process allows for finer pitched structures to be manufactured. Particularly, the pitch of the vertically oriented planes may be matched to the pitch of the FLI pads. As such, no lateral routing is needed, and ohmic losses due to lateral routing are eliminated. Additionally, the vertically oriented planes may shunt together bumps (e.g., power or ground bumps) of a certain power domain and create a solid plane of conductive material (e.g., copper) through the core. This allows for a much lower resistance through the core compared to the use of one or several PTHs which would have a much lower cross-sectional area through the core.

The laser-assisted etching process allows for the formation of crack free, high-density via holes and planes into the core substrate. Whereas existing through core vias (e.g., PTHs) have diameters of 100 μm or larger and pitches of 250 μm or larger, the laser-assisted etching process may enable hole diameters and plane thicknesses that are approximately 50 μm or smaller and pitches that are approximately 40 μm or larger. Diameters of the holes and thicknesses of planes may be able to be approximately 10 μm without masks, and potentially as small as 2 μm when a hardmask is also used. The thickness of the core may also be between approximately 100 μm and 1,000 μm. Though it is to be appreciated that embodiments may also apply to larger and/or smaller hole diameters, plane thicknesses, pitches, and core substrate thicknesses.

Figure 2A:
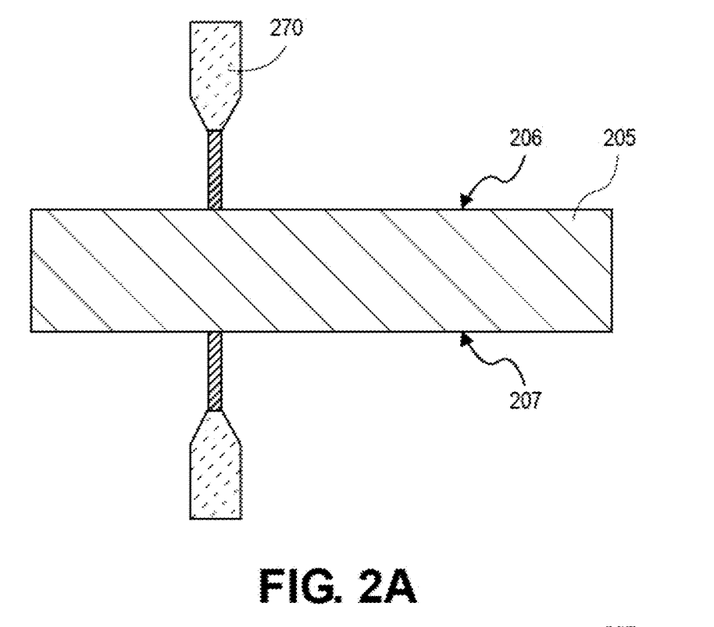
FIG. 2A is a cross-sectional illustration of a glass core with top and bottom surfaces that are being exposed with a laser, in accordance with an embodiment.

Referring now to FIGS. 2A-2D, a series of cross-sectional illustrations depicting a process for forming a hole in a core substrate 205 using a laser-assisted etching process is shown, in accordance with an embodiment. In FIGS. 2A-2D, the hole is shown in a single cross-section. However, it is to be appreciated that the hole may be extended to form trenches suitable for the formation of vertically oriented planes in addition to standard vias. As shown in FIG. 2A, the core substrate 205 is exposed by a laser 270. The laser 270 may be irradiated over both a first surface 206 and a second surface 207. However, the laser 270 may only irradiate a single surface of the core substrate 205 in other embodiments. In order to form a trench for a vertically oriented plane, the laser 270 may be scanned across the surface of the core substrate 205.

In an embodiment, the core substrate 205 may comprise a material that is capable of forming a morphological change as a result of the exposure by the laser 270. For example, in the case of a glass core substrate 205, the morphological change may result in the conversion of an amorphous crystal structure to a crystalline crystal structure. While glass is used as an example here, it is to be appreciated that the core substrate 205 may also comprise ceramic materials, silicon, or other non-conductive semiconductor materials. In an embodiment, the core substrate 205 may have a thickness between the first surface 206 and the second surface 207 that is between 100 μm and 1,000 μm. However, it is to be appreciated that larger or smaller thicknesses may also be used for the core substrate 205 in other embodiments.

Figures 2B, 2C:
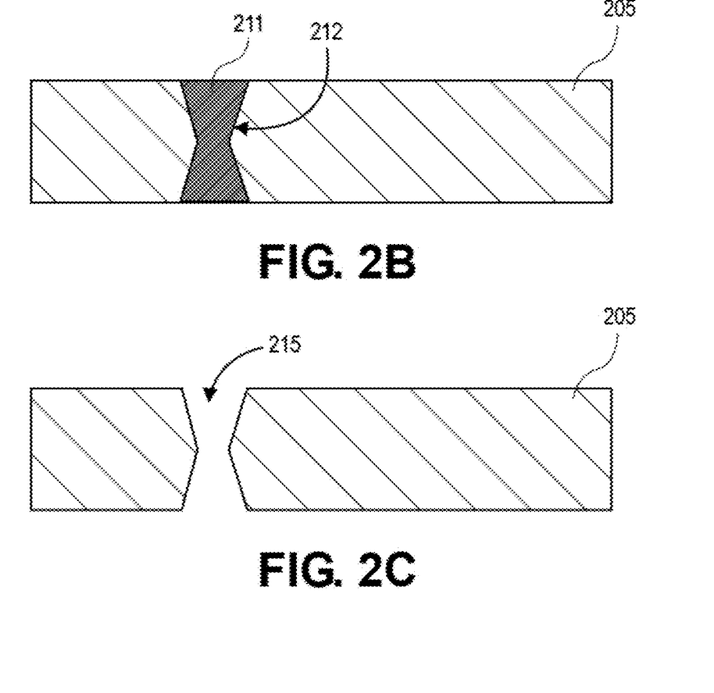
FIG. 2B is a cross-sectional illustration of the glass core with regions that have their morphology altered by the laser, in accordance with an embodiment.
FIG. 2C is a cross-sectional illustration of the glass core with a via hole through a thickness of the glass core, in accordance with an embodiment.

Referring now to FIG. 2B, a cross-sectional illustration of the core substrate 205 after the morphological change has occurred is shown, in accordance with an embodiment. As shown, an exposed region 211 is provided through a thickness of the core substrate 205. In an embodiment, the exposed region 211 may have sidewalls 212 that are sloped. That is, the sidewalls 212 may not be substantially vertical (with respect to the first surface 206 and the second surface 207). In a particular embodiment, the exposed region 211 may have an hourglass shaped cross-section that results from exposure from laser exposure on both the first surface 206 and the second surface 207. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 212 may have a slope that is approximately 10° or less away from vertical. While shown with sloped sidewalls 212, it is also to be appreciated that embodiments may include substantially vertical sidewalls depending on the laser parameters and the material of the core substrate 205.

Referring now to FIG. 2C, a cross-sectional illustration of the core substrate 205 after the exposed region 211 is removed to form a hole 215 through the core substrate 205 is shown, in accordance with an embodiment. Similarly, in the case of forming a vertically oriented plane, a trench may be formed instead of a hole 215. In an embodiment, the hole 215 may be formed with an etching process that is selective to the exposed region 211 over the remainder of the core substrate 205. The etch selectivity of the exposed region 211 to the remainder of the core substrate 205 may be 10:1 or greater, or 50:1 or greater. That is, while selective to the exposed region 211, some portion of the core substrate 205 may also be etched, resulting in the thickness of the core substrate 205 being slightly reduced. In an embodiment, the etchant may be a wet etching chemistry.

Figure 2D:
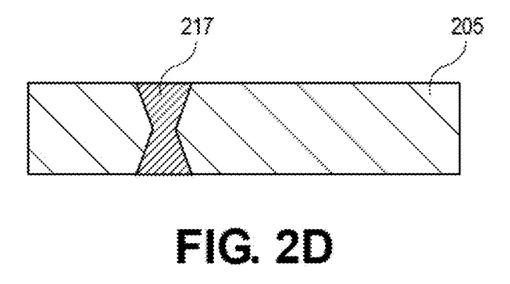
FIG. 2D is a cross-sectional illustration of the glass core with a via through the thickness of the glass core, in accordance with an embodiment.

Referring now to FIG. 2D, a cross-sectional illustration of the core substrate 205 after a via 217 is formed in the hole 215 is shown, in accordance with an embodiment. In the case of a hole 215 that is extended into a trench, the via 217 may instead be a vertically oriented plane. In an embodiment, the via 217 may be deposited with a plating process or any other suitable deposition process.

In an embodiment, the hole 215 may have a maximum diameter that is approximately 100 μm or less, approximately 50 μm or less, or approximately 10 μm or less. The pitch between individual holes 215 in the core substrate 205 may be between approximately 10 μm and approximately 100 μm in some embodiments. The small diameters and pitch (compared to traditional PTH vias that typically have diameters that are 100 μm or larger and pitches that are 100 μm or larger) allow for high density integration of vias and vertically oriented planes. In the case of vertically oriented planes, the planes may have a pitch that is equal to a first level interconnect (FLI) pitch. As such, lateral routing is not needed and ohmic losses can be reduced.

In FIGS. 2A-2D only a single cross-section of the core substrate 205 is shown for simplicity. However, it is to be appreciated that the shape of the vias 217 may take substantially any form. This is because the laser providing the morphological change in the core substrate 205 may be moved in a controllable manner. Examples of various plan views of a vias 317 in a core substrate 305 are shown in FIGS. 3A and 3B.

Figure 3A:
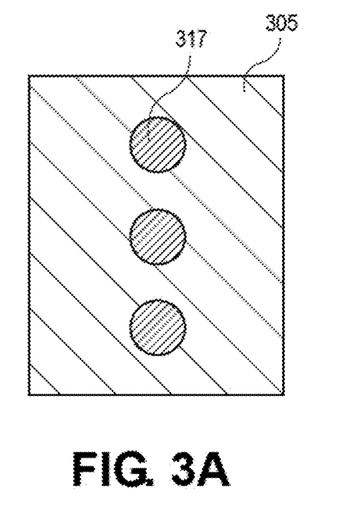
FIG. 3A is a plan view illustration of the glass core with a plurality of circular vias, in accordance with an embodiment.
Figure 3B:
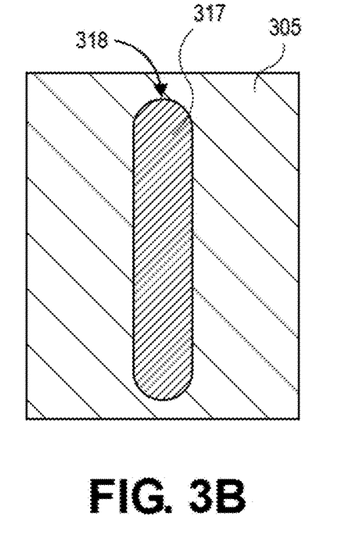
FIG. 3B is a plan view illustration of the glass core with a vertical via plane, in accordance with an embodiment.

Referring now to FIG. 3A, a plan view illustration of a core substrate 305 with a plurality of circular vias 317 is shown, in accordance with an embodiment. While three vias 317 are shown, it is to be appreciated that any number of vias 317 may be provided in any configuration. Referring now to FIG. 3B, a plan view illustration of a core substrate 305 with a via 317 that is extended along one direction to form a vertically oriented plane is shown, in accordance with an embodiment. Such a structure 317 may be referred to herein as a "via plane" or simply a "plane". The plane 317 may have a thickness through the core substrate 305 that is substantially uniform, while also being extended in a direction, as opposed to having a width and length that are substantially uniform. As shown in FIG. 3B, the ends of the plane 317 may be rounded surfaces 318. The rounded surfaces may be the result of the shape of the laser irradiation. That is, the focus of the laser may be substantially circular in some embodiments.

Figure 4A:
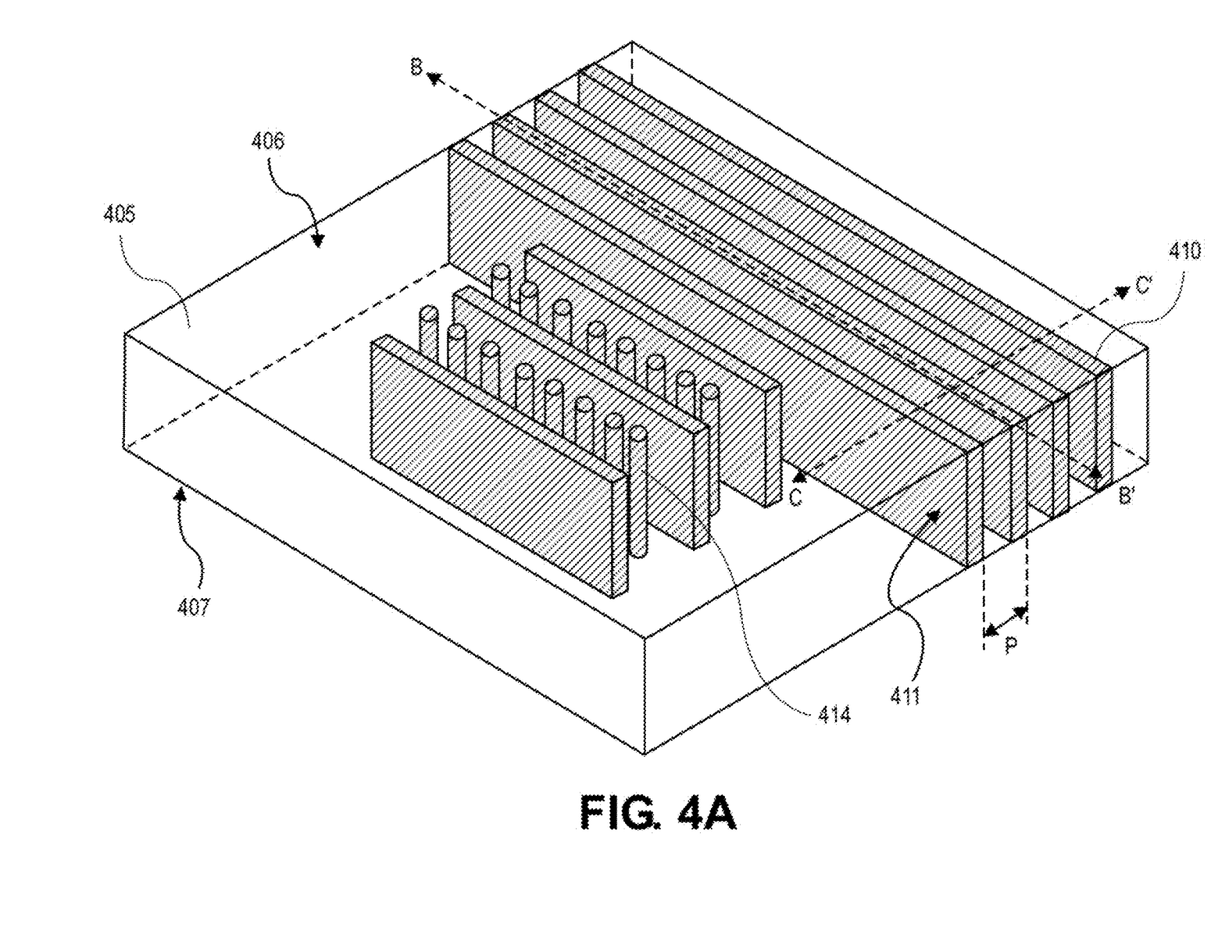
FIG. 4A is a perspective view illustration of a core of a package substrate with vertically oriented power planes through a thickness of the core, in accordance with an embodiment.

Referring now to FIG. 4A, a perspective view illustration of a core 405 is shown, in accordance with an embodiment. In an embodiment, the core 405 may comprise a material that is capable of undergoing a morphological change when exposed to a laser in order to implement a laser-assisted etching process. For example, the core 405 may be a glass core 405. In an embodiment, the core 405 may be part of a package substrate. For example, buildup layers may be provided above and below the core 405. In the interest of clarity, the buildup layers and conductive routing in the buildup layers are not shown in FIG. 4A. In an embodiment, the core 405 may have a thickness between a first surface 406 and a second surface 407 that is between approximately 100 μm and approximately 1,000 μm.

In an embodiment, conductive features may be embedded in the core 405. One such conductive feature may be a vertically oriented plane 410. The vertically oriented plane 410 may have a major surface 411 that is substantially orthogonal to the first surface 406 of the core 405. In an embodiment, the vertically oriented plane 410 may pass through an entire thickness of the core 405. That is, a height of the vertically oriented plane 410 may start at the second surface 407 and end at the first surface 406. However, it is to be appreciated that in some instances a height of a vertically oriented plane 410 may be less than the thickness of the core 405. Such a vertically oriented plane 410 may be referred to as a blind plane.

In an embodiment, the core 405 may comprise a plurality of vertically oriented planes 410. As shown in FIG. 4A, the vertically oriented planes 410 may be substantially parallel to each other. In an embodiment, the vertically oriented planes 410 may be spaced at a pitch P. In an embodiment, the pitch P may be approximately 50 μm or smaller. The pitch P may be the same pitch as overlying FLI pads (not shown). As such, vertical connections through the buildup layers can connect the vertically oriented planes 410 directly to the FLI pads without the need for lateral routing.

In a particular embodiment, one or more of the vertically oriented planes 410 may be configured to provide power delivery through a thickness of the core 405. Providing power delivery through the core 405 with vertically oriented planes 410 is particularly beneficial because of the reduced resistance compared to PTH architectures. Instead of routing a power domain across one or several PTH, a plurality of power bumps of a certain power domain can be shunted together. The power passes through the core 405 by way of the larger surface area of the vertically oriented plane 410 (compared to the surface area of a PTH). As such, a reduction in resistance can be provided in accordance with embodiments disclosed herein. In addition to providing low resistance power paths through the core 405, vertically oriented planes 410 may be used for other routing as well. For example, similar benefits are provided when the vertically oriented planes 410 are configured to provide routing of a ground through the core 405.

As shown in FIG. 4A, vias 414 may also be embedded in the core 405. The vias 414 may pass from the first surface 406 to the second surface 407 in some embodiments. In other embodiments, blind vias 414 may also be included in the core 405. The vias 414 may be fabricated in parallel with the vertically oriented planes 410. Whereas the vertically oriented planes 410 are fabricated by scanning the laser across the surface of the core 405, the formation of vias 414 may use a stationary laser exposure. Since both the vias 414 and the vertically oriented planes 410 are formed with similar laser-assisted etching processes, the two features may share a common cross-sectional shape. For example, as described above, the vertically oriented planes 410 and the vias 414 may have sidewalls that are sloped, or have hourglass shaped cross-sections.

In an embodiment, the vias 414 may be configured to provide I/O signaling through the thickness of the core 405. For example two rows of vias 414 may be used for I/O signaling. In an embodiment, the vertically oriented planes 410 adjacent to the I/O vias 414 may be ground planes. While the majority of the power delivery may be applied over vertically oriented planes 410, in some embodiments, vias 414 may also be used for power delivery and/or ground.

Figure 4B:
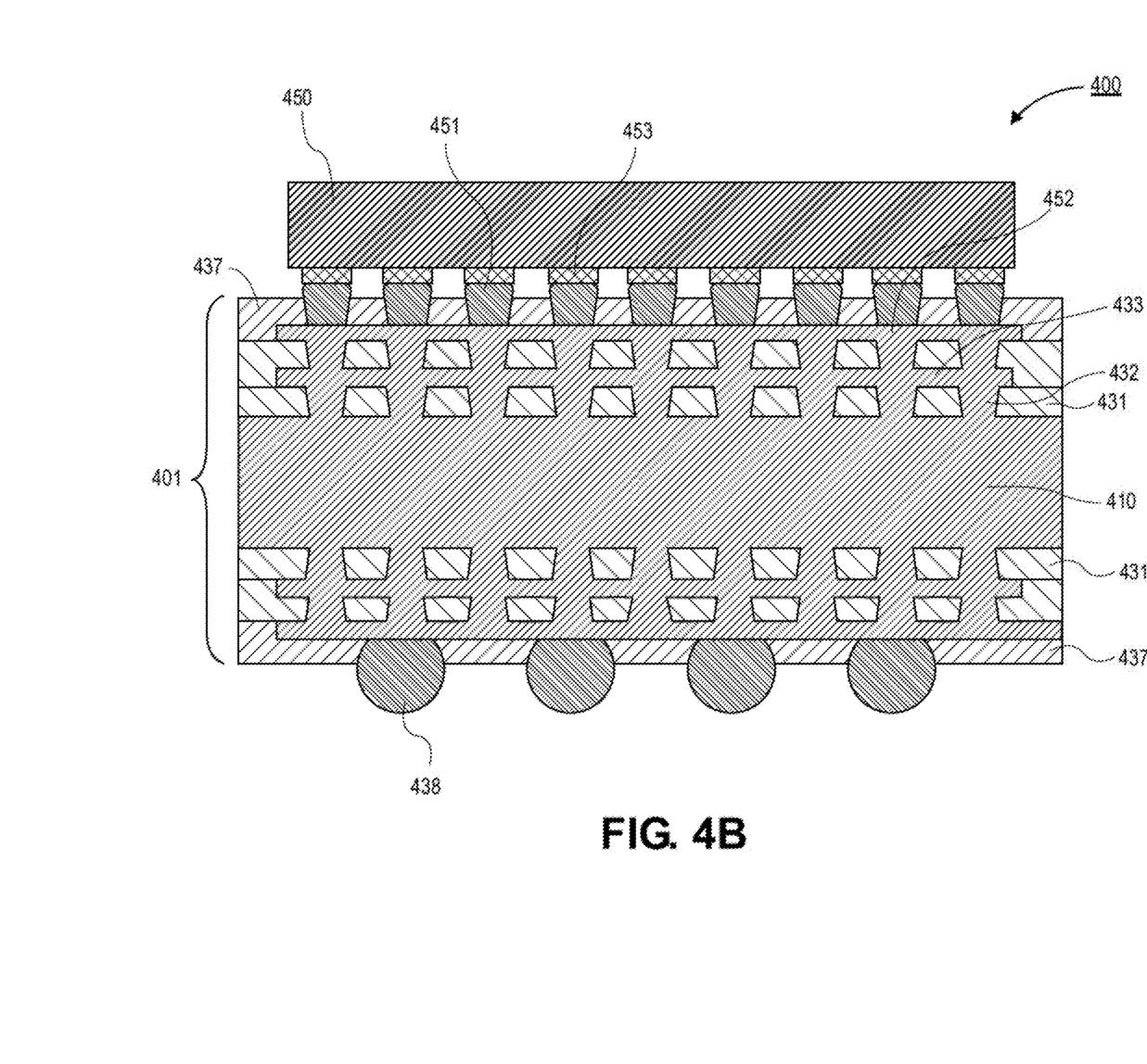
FIG. 4B is a cross-sectional illustration of an electronic package along the length of one of the vertically oriented power planes in the core, in accordance with an embodiment.
Figure 4C:
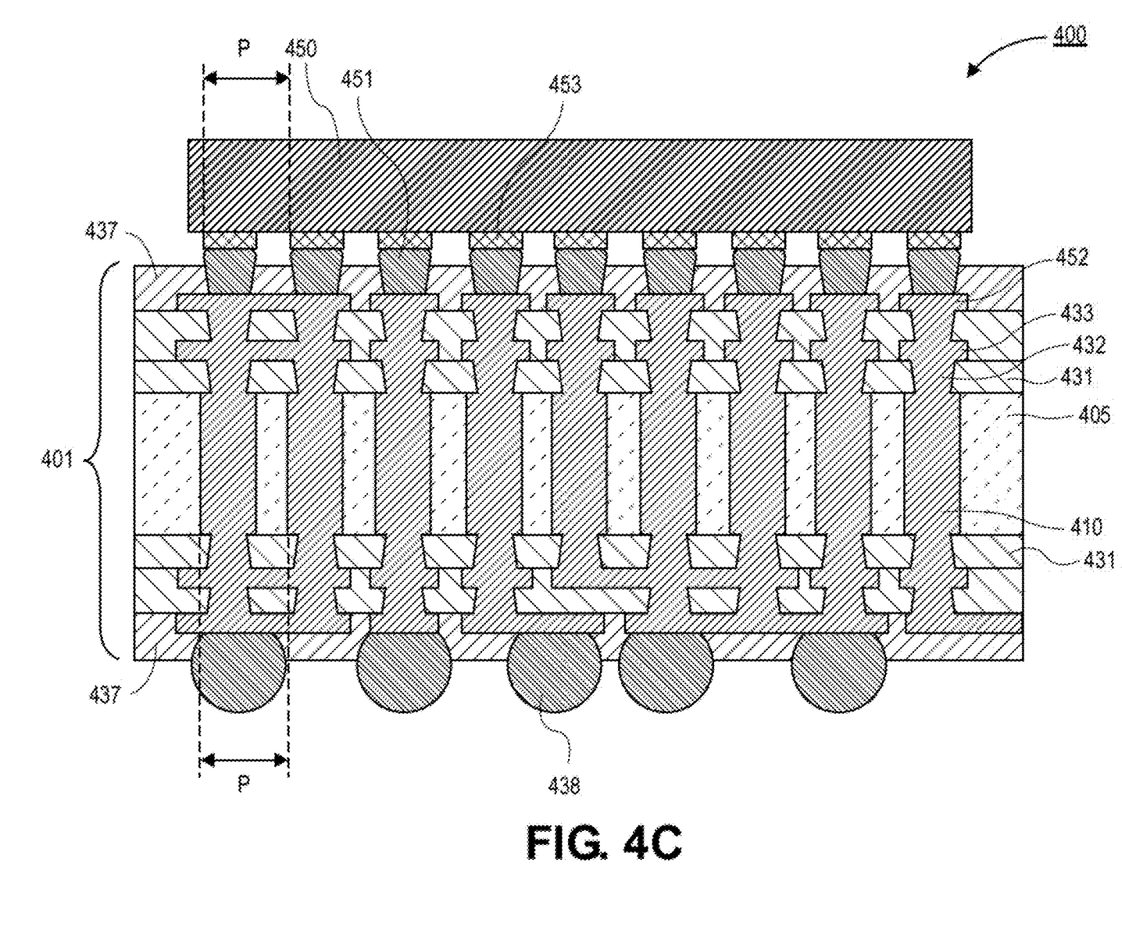
FIG. 4C is a cross-sectional illustration of an electronic package across a plurality of vertically oriented power planes in the core, in accordance with an embodiment.

Referring now to FIGS. 4B and 4C, cross-sectional illustrations of an electronic package 400 are shown. The cross-section in FIG. 4B is along a plane similar to a cross-section of FIG. 4A along line B-B', and the cross-section in FIG. 4C is along a plane similar to a cross-section of FIG. 4A along line C-C'. However, in FIGS. 4B and 4C, the layers and features overlying and underlying the core 405 are also shown.

Referring now to FIG. 4B, a cross-sectional illustration of an electronic package 400 is shown, in accordance with an embodiment. In an embodiment, the electronic package 400 comprises a package substrate 401 and a die 450 coupled to the package substrate 401. FLI pads 452 of the package substrate 401 may be coupled to pads 453 on the die 450 by FLIs 451. In FIG. 4B, the FLIs 451 are illustrated as solder interconnects. However, it is to be appreciated that the FLIs 451 may be any FLI architecture, such as copper bumps, solder balls, or the like. The FLIs 451 may pass through a solder resist 437 on the package substrate 401. Second level interconnects 438 may be provided through a solder resist 437 on the opposite surface of the package substrate 401.

In an embodiment, the die 450 may be any type of die, such as, but not limited to, a processor, a system on a chip (SoC), a graphics processor, and a memory. The die 450 may also be an interposer onto which additional dies are connected. For example, dies of an advanced process node may be tiled together by an interposer die 450 of a lower process node.

In an embodiment, the package substrate 401 comprises a core and buildup layers 431 over the core. In the plane illustrated in FIG. 4B, the core is not shown. The core would be into the plane and out of the plane on either side of the vertically oriented plane 410. As shown in FIG. 4B, each of the FLIs 451 may be shunted to the single vertically oriented plane 410. That is, FLI pads 452, traces 433, and vias 432 may all be shorted together. Each FLI 451 has a direct vertical path to the vertically oriented plane 410. In the embodiment shown in FIG. 4B it is assumed that each of the illustrated FLIs 451 are part of a single power domain. Furthermore, while shown as extending across the entire width of the die 450 in FIG. 4B, it is to be appreciated that the vertically oriented plane 410 may not necessarily extend across an entire width of the die 450 in some embodiments.

Referring now to FIG. 4C, a cross-sectional illustration of an electronic package 400 is shown, in accordance with an embodiment. The cross-sectional view in FIG. 4C is across the thickness of the vertically oriented planes 410. As such, a plurality of substantially parallel vertically oriented planes 410 are depicted in FIG. 4C. Each of the vertically oriented planes 410 may be separated from each other by portions of the core 405. Due to the fine patterning capabilities provided by laser-assisted etching processes used to form the vertically oriented planes 410, the pitch P of the vertically oriented planes 410 may be substantially the same as the pitch P of the FLIs 451. In a particular embodiment, the pitch P may be approximately 150 µm or smaller, approximately 100 µm or smaller or approximately 50 µm or smaller. The pitch P may also be approximately 30 µm or smaller in some embodiments. As such, there is no need for lateral routing in the buildup layers 431. As shown in FIG. 4C, each vertically oriented plane 410 is directly below one of the die pads 453 and FLIs 451. Any lateral routing (e.g., by trace 433) may be to tie together power domains in different rows.

In FIG. 4C, each of the vertically oriented planes 410 are shown with a constant pitch P. However, it is to be appreciated that vertically oriented planes 410 may have non-uniform pitches in some embodiments. For example, a first set of vertically oriented planes 410 may have a first pitch, a second set of vertically oriented planes 410 may have a second pitch that is different than the first pitch. Of course, it is to be understood that vertically oriented planes 410 within a single core 405 may have more than two different pitches as well.

Figure 4D:
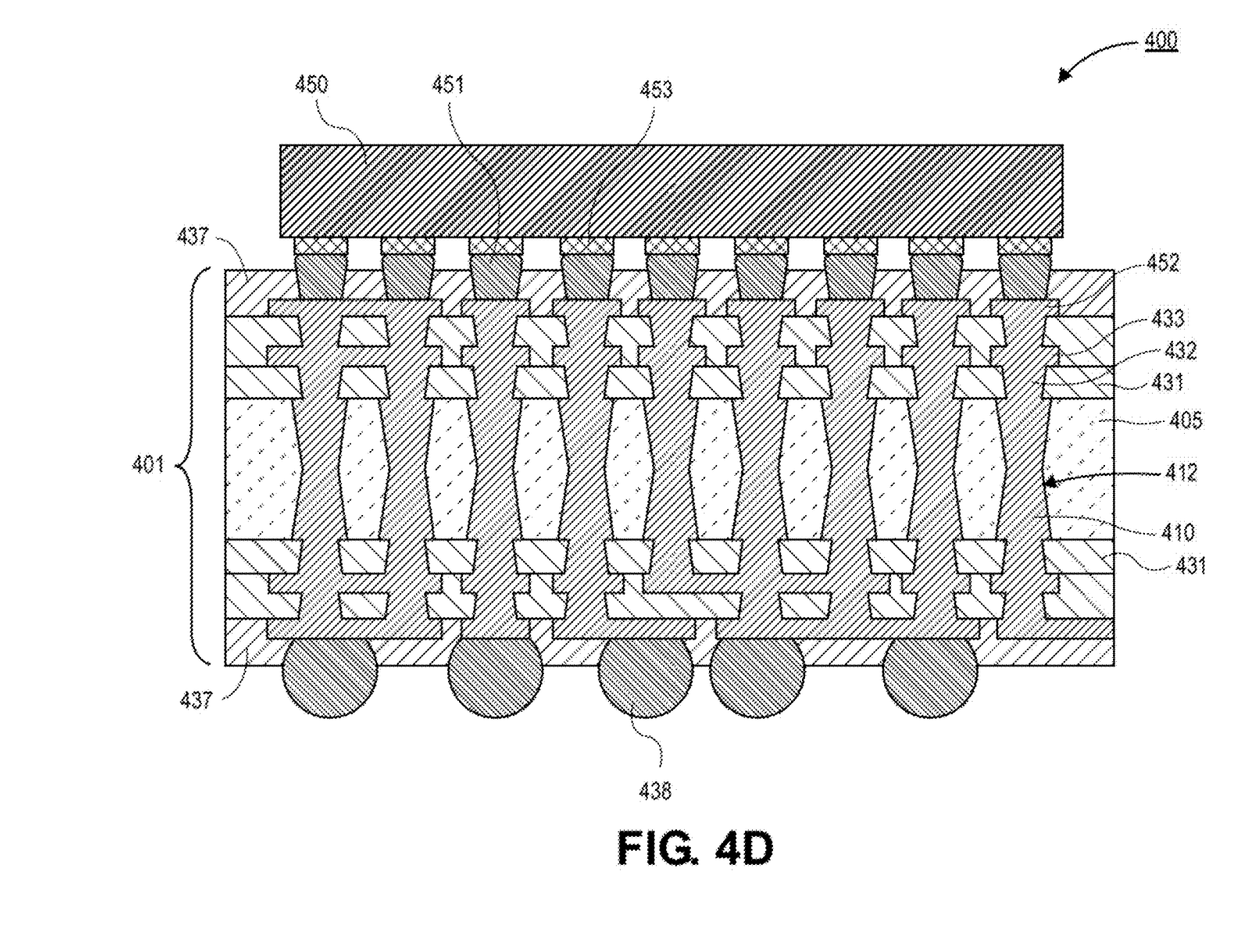
FIG. 4D is a cross-sectional illustration of an electronic package across a plurality of vertically oriented power planes with hourglass shaped cross-sections, in accordance with an embodiment.

Referring now to FIG. 4D, a cross-sectional illustration of an electronic package 400 is shown, in accordance with an additional embodiment. The electronic package 400 in FIG. 4D may be substantially similar to the electronic package 400 in FIG. 4C, with the exception of the structure of the vertically oriented planes 410. Instead of having substantially vertical sidewalls (as shown in FIG. 4D), the vertically oriented planes 410 have sidewalls 412 that are sloped. The slope of the sidewalls 412 may be a result of the laser-assisted etching process used to form the vertically oriented planes 410. In a particular embodiment, the sidewalls 412 may be sloped in a manner that results in a cross-section of the vertically oriented planes 410 being hourglass shaped.

As described above, each vertically oriented plane 410 had a major surface 411 that was substantially orthogonal to the top or bottom surface of the core 405. In the case of sidewalls 412 as shown in FIG. 4D, the sidewalls 412 may not necessarily be exactly orthogonal to the top or bottom surface of the core 405. However, as used herein, the sloped sidewalls 412 (and hourglass shaped cross-sections) characteristic of laser-assisted etching processes will be considered to be at least "substantially orthogonal" to the top or bottom surface of the core 405. In another embodiment, "substantially orthogonal" may refer to a surface that has any portion that is within 30° of being perfectly orthogonal to the top or bottom surface of the core 405.

Figure 5A:
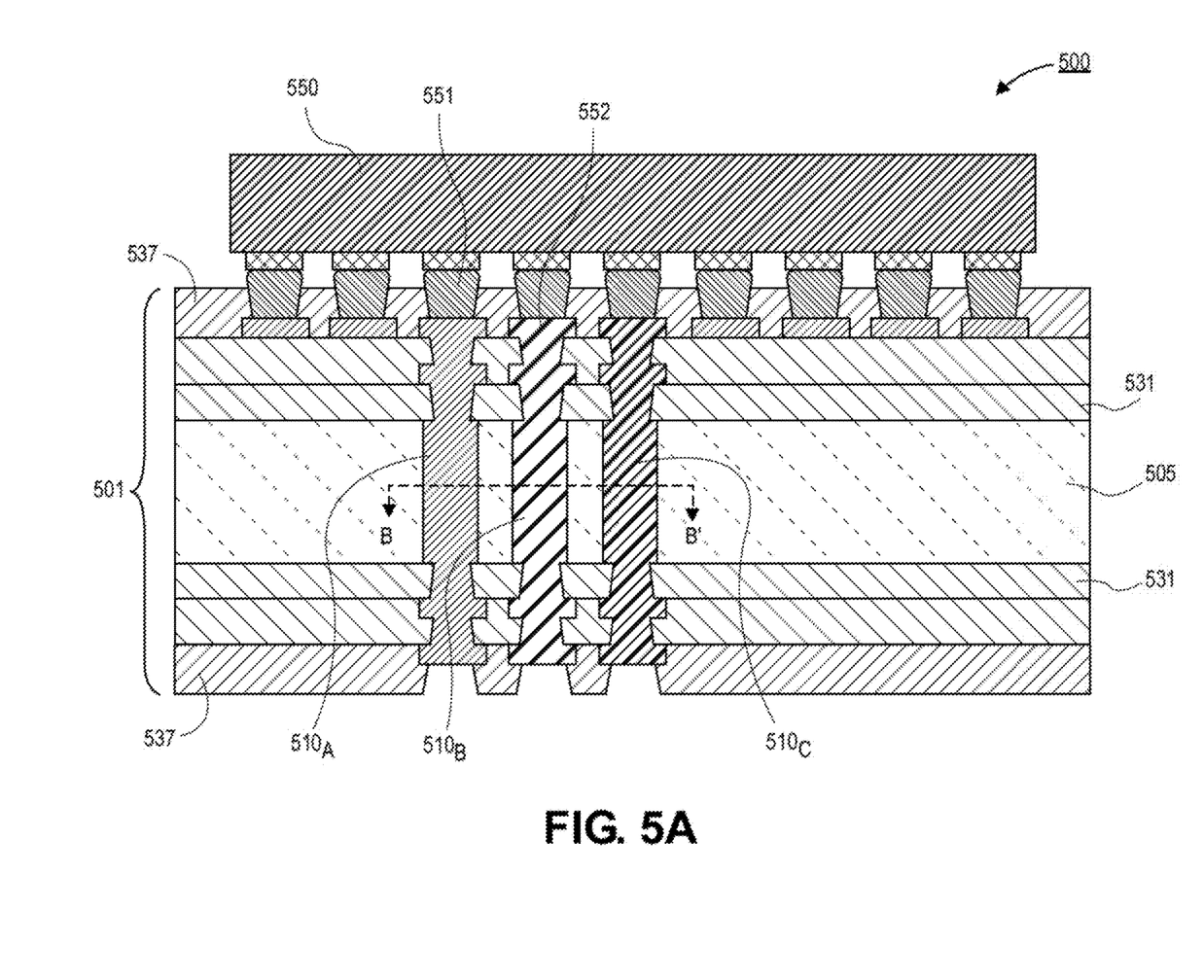
FIG. 5A is a cross-sectional illustration of an electronic package with vertically oriented planes that are configured to supply different voltage levels and a ground, in accordance with an embodiment.

Referring now to FIG. 5A, a cross-sectional illustration of an electronic package 500 is shown, in accordance with an additional embodiment. The electronic package 500 may be similar to electronic package 400 described above in several aspects. For example, electronic package 500 comprises a package substrate 501 that is coupled to a die 550 by FLIs 551 on FLI pads 552. Vertical connections between vertically oriented planes 510 in the core 505 and the FLIs 551 may be made through buildup layers 531 and solder resist layers 537.

What is illustrated explicitly in FIG. 5A is the configuration of vertically oriented planes 510 configured to be held at different voltages. For example, a first vertically oriented plane $510_A$ may be configured to service a first power domain at a first voltage, a second vertically oriented plane $510_B$ may be configured to service a second power domain at a second voltage, and a third vertically oriented plane $510_C$ may be configured to provide a ground voltage through the core 505. While two power domains and a ground are shown in FIG. 5A, it is to be appreciated that any number of power domains and or grounds may be provided using similar configurations.

Figure 5B:
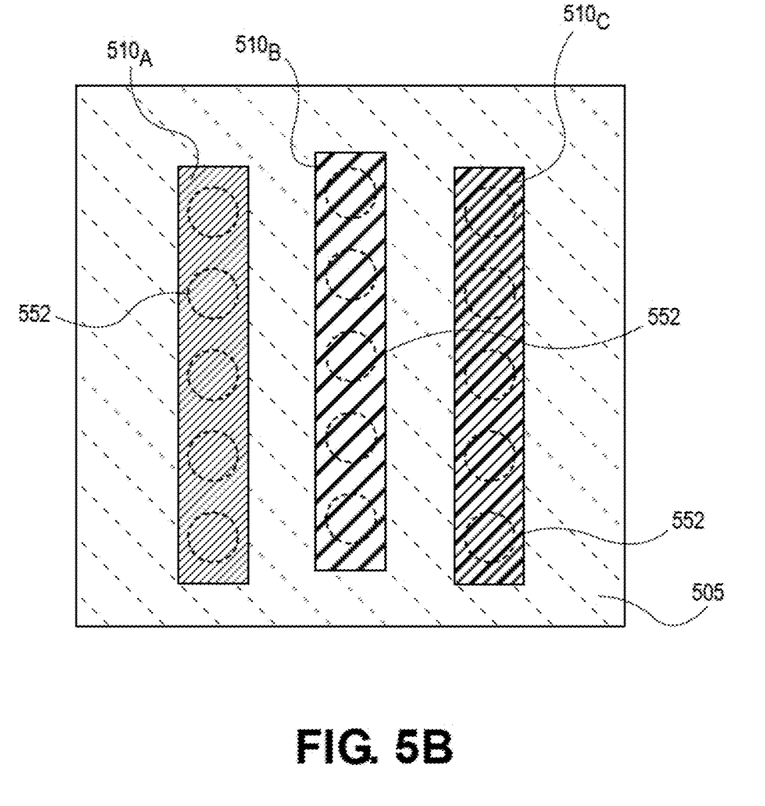
FIG. 5B is a plan view illustration of the core showing the length of the vertically oriented planes in FIG. 5A, in accordance with an embodiment.

Referring now to FIG. 5B, a top view of the electronic package 500 in FIG. 5A is shown, in accordance with an embodiment. As shown, each of the vertically oriented planes $510_A$-$510_C$ extend below a plurality FLI pads 552 (indicated with dashed arrows to indicate they are above the planes $510_A$-$510_C$). In such instances, each row of FLI pads 552 are shunted together and serviced by a single vertically oriented plane $510_A$-$510_C$. As such, the resistance through the core is reduced since a large surface area vertically oriented plane 510 is used (compared to a PTH). Additionally, since the pitch of the vertically oriented planes 510 can match the pitch of the FLI pads 552, there is no need for any lateral routing in the buildup layer 531, which also reduces ohmic losses.

Figure 6:
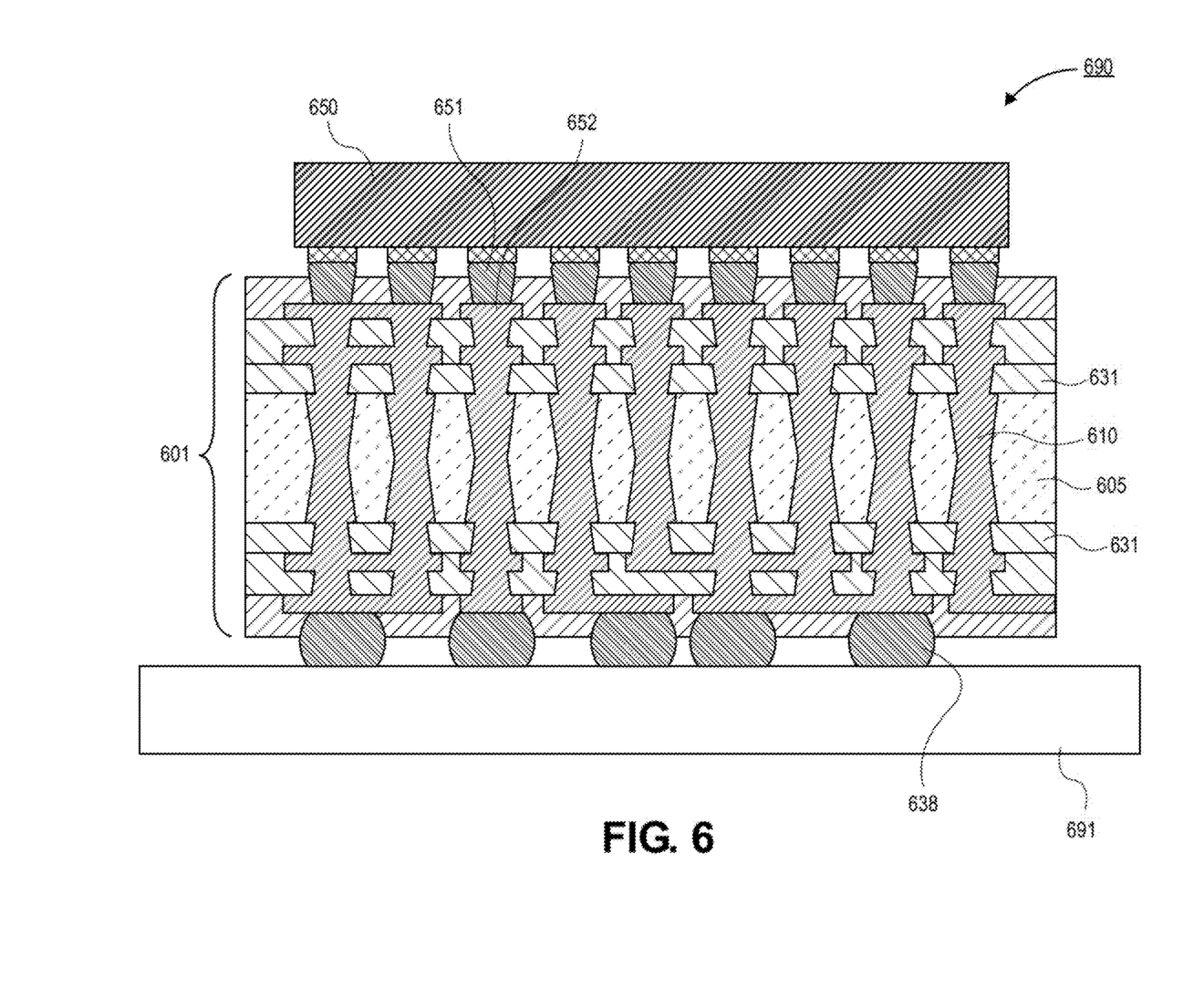
FIG. 6 is a cross-sectional illustration of an electronic system with a package substrate that comprises a core with vertically oriented planes, in accordance with an embodiment.

Referring now to FIG. 6, a cross-sectional illustration of an electronic system 690 is shown, in accordance with an embodiment. In an embodiment, the electronic system 690 comprises a board 691, such as a printed circuit board (PCB) or the like. The board 691 may be coupled to a package substrate 601 by interconnects 638. In an embodiment, the interconnects 638 may be solder balls, sockets, or any other suitable interconnect architecture.

In an embodiment, the package substrate 601 comprises a core 605 with buildup layers 631 above and below the core 605. In an embodiment, the core 605 is a material that can undergo a morphological change when exposed to a laser used in a laser-assisted etching process. For example, the core 605 may be a glass core 605.

In an embodiment, a plurality of vertically oriented planes 610 may be provided through a thickness of the glass core 605. As shown, each of the vertically oriented planes 610 may be directly below an FLI pad 652 and FLI 651. That is, a pitch of the vertically oriented planes 610 may be substantially similar to a pitch of the FLIs 651. In an embodiment, each of the vertically oriented planes 610 may be below multiple FLI pads 652 (i.e., into and out of the plane of FIG. 6). In the illustrated embodiment, the sidewalls of the vertically oriented planes 610 are sloped so as to form an hourglass shaped cross-section. In other embodiments, the sidewalls may be substantially vertical.

In an embodiment, the electronic system 690 may further comprise a die 650 that is coupled to the package substrate 601 by the FLIs 651. The die 650 may be any type of die, such as, but not limited to, a processor, an SoC, a graphics processor, and a memory. In other embodiments, the die 650 may be an interposer that is used to stitch together additional dies connected to a top surface of the interposer.

Figure 7:
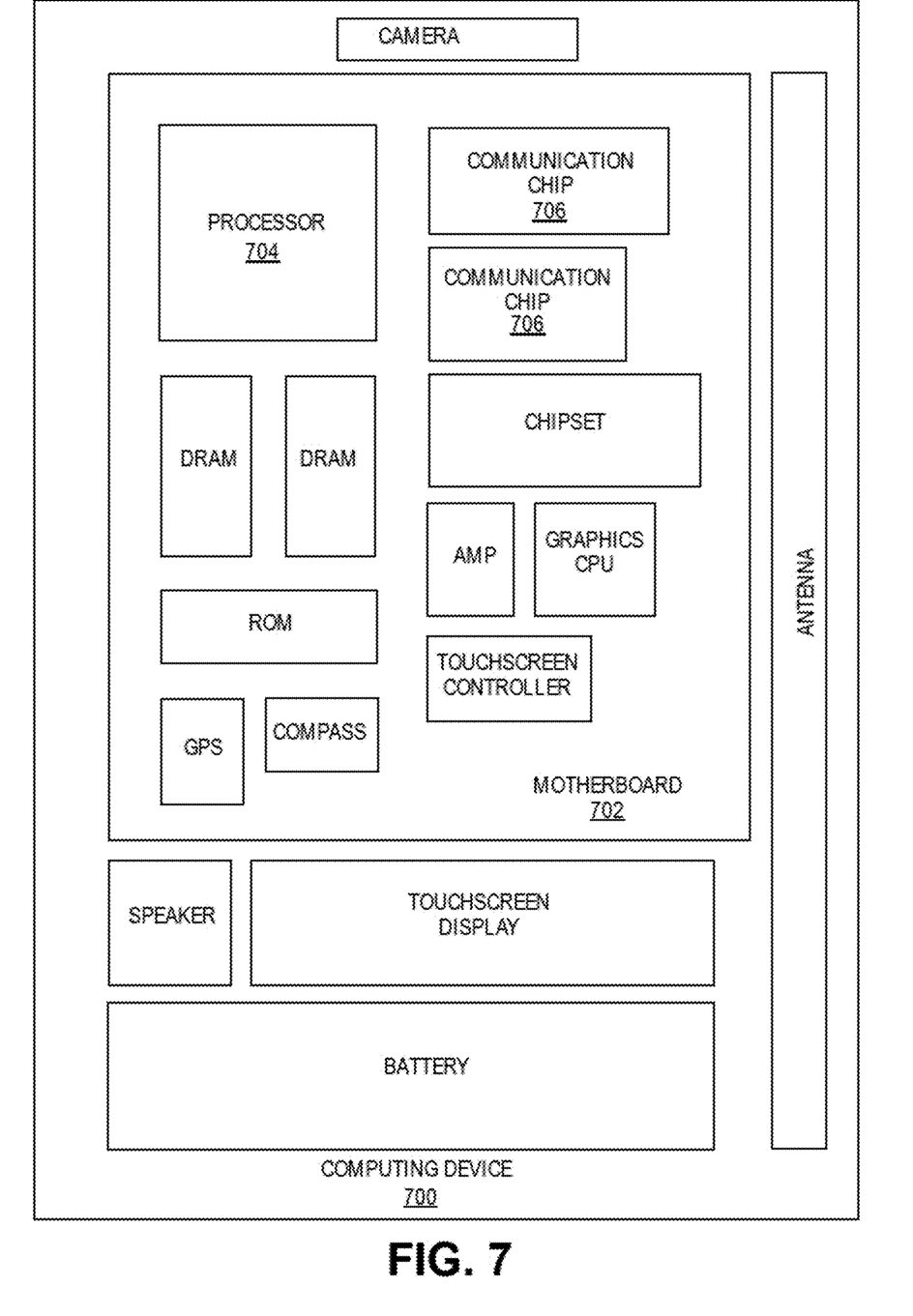
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic package that comprises a package substrate with a core that is patterned with a laser-assisted etching process to form vertically oriented planes, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic package that comprises a package substrate with a core that is patterned with a laser-assisted etching process to form vertically oriented planes, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: package substrate, comprising: a core; buildup layers on the core; first level interconnect (FLI) pads on a topmost buildup layer, wherein the FLI pads have a pitch; and a plurality of vertically oriented planes embedded in the core, wherein the vertically oriented planes are spaced at the pitch.

Example 2: the package substrate of Example 1, wherein the individual ones of the plurality of vertically oriented planes are electrically coupled to FLI pads directly above the individual ones of the plurality of vertically oriented planes.

Example 3: the package substrate of Example 1 or Example 2, wherein individual ones of the plurality of vertically oriented planes have sidewalls that are sloped.

Example 4: the package substrate of Example 3, wherein individual ones of the plurality of vertically oriented planes have hourglass shaped cross-sections.

Example 5: the package substrate of Examples 1-3, further comprising vias through the core.

Example 6: the package substrate of Example 5, wherein the vias are configured to be used for I/O signals, ground, or power.

Example 7: the package substrate of Examples 1-6, wherein the plurality of vertically oriented planes are configured to be used for power planes or ground planes.

Example 8: the package substrate of Examples 1-7, wherein the core is a glass core.

Example 9: the package substrate of Examples 1-8, wherein the pitch is approximately 150 μm or smaller.

Example 10: the package substrate of Examples 1-9, wherein the plurality of vertically oriented planes pass through an entire thickness of the core.

Example 11: the package substrate of Examples 1-10, further comprising: a second plurality of vertically oriented planes, wherein the second plurality of vertically oriented planes have a second pitch that is different than the first pitch.

Example 12: a package substrate, comprising: a core with a first surface and a second surface opposite from the first surface; and a conductive plane embedded in the core, wherein the conductive plane comprises a major surface that is substantially orthogonal to the first surface.

Example 13: the package substrate of Example 12, wherein a cross-section of the conductive plane is hourglass shaped.

Example 14: the package substrate of Example 12 or Example 13, wherein a thickness of the conductive plane is approximately 50 μm or smaller.

Example 15: the package substrate of Examples 12-13, further comprising: a via through a thickness of the core, wherein the via has a cross-sectional shape, and wherein the conductive plane has the cross-sectional shape.

Example 16: the package substrate of Examples 12-15, wherein the core is a glass core.

Example 17: the package substrate of Examples 12-16, wherein the conductive plane passes through an entire thickness of the core.

Example 18: the package substrate of Examples 12-17, wherein the conductive plane is configured to serve as a power plane.

Example 19: the package substrate of Examples 12-17, wherein the conductive plane is configured to serve as a ground plane.

Example 20: the package substrate of Examples 12-19, further comprising a second conductive plane embedded in the core, wherein the second conductive plane is substantially parallel to the conductive plane.

Example 21: the package substrate of Example 20, wherein the second conductive plane and the conductive plane have a pitch, wherein the pitch is approximately 150 μm or smaller.

Example 22: an electronic system, comprising: a board; a package substrate coupled to the board, wherein the package substrate comprises: a core; buildup layers on the core; first level interconnect (FLI) pads on a topmost buildup layer, wherein the FLI pads have a pitch; and a plurality of vertically oriented planes embedded in the core, wherein the vertically oriented planes are spaced at the pitch; and a die coupled to the package substrate by the FLI pads.

Example 23: the electronic system of Example 22, wherein the core is a glass core.

Example 24: the electronic system of Example 22 or Example 23, wherein cross-sections of individual ones of the plurality of vertically oriented planes are hourglass shaped.

Example 25: the electronic system of Examples 22-24, wherein the pitch is approximately 50 µm or smaller.

What is claimed is:

1. A package substrate, comprising:
a core;
buildup layers on the core;
first level interconnect (FLI) pads on a topmost buildup layer, wherein the FLI pads have a pitch; and
a plurality of vertically oriented planes embedded in the core, wherein individual ones of the plurality of vertically oriented planes are spaced at the pitch, and wherein one or more of the plurality of vertically oriented planes have a horizontal length extending an entirety of a horizontal length of the core.

2. The package substrate of claim 1, wherein the individual ones of the plurality of vertically oriented planes are electrically coupled to FLI pads directly above the individual ones of the plurality of vertically oriented planes.

3. The package substrate of claim 1, wherein individual ones of the plurality of vertically oriented planes have sidewalls that are sloped.

4. The package substrate of claim 3, wherein individual ones of the plurality of vertically oriented planes have hourglass shaped cross-sections.

5. The package substrate of claim 1, further comprising vias through the core.

6. The package substrate of claim 5, wherein the vias are configured to be used for I/O signals, ground, or power.

7. The package substrate of claim 1, wherein the plurality of vertically oriented planes are configured to be used for power planes or ground planes.

8. The package substrate of claim 1, wherein the core is a glass core.

9. The package substrate of claim 1, wherein the pitch is approximately 150 µm or smaller.

10. The package substrate of claim 1, wherein the plurality of vertically oriented planes pass through an entire thickness of the core.

11. The package substrate of claim 1, further comprising:
a second plurality of vertically oriented planes.

12. A package substrate, comprising:
a core with a first surface and a second surface opposite from the first surface; and
a conductive plane embedded in the core, wherein the conductive plane comprises a major surface that is substantially orthogonal to the first surface, and wherein the conductive plane has a horizontal length extending an entirety of a horizontal length of the core.

13. The package substrate of claim 12, wherein a cross-section of the conductive plane is hourglass shaped.

14. The package substrate of claim 12, wherein a thickness of the conductive plane is approximately 50 µm or smaller.

15. The package substrate of claim 12, further comprising:
a via through a thickness of the core, wherein the via has a cross-sectional shape, and wherein the conductive plane has the cross-sectional shape.

16. The package substrate of claim 12, wherein the core is a glass core.

17. The package substrate of claim 12, wherein the conductive plane passes through an entire thickness of the core.

18. The package substrate of claim 12, wherein the conductive plane is configured to serve as a power plane.

19. The package substrate of claim 12, wherein the conductive plane is configured to serve as a ground plane.

20. The package substrate of claim 12, further comprising a second conductive plane embedded in the core, wherein the second conductive plane is substantially parallel to the conductive plane.

21. The package substrate of claim 20, wherein the second conductive plane and the conductive plane have a pitch, wherein the pitch is approximately 150 µm or smaller.

22. An electronic system, comprising:
a board;
a package substrate coupled to the board, wherein the package substrate comprises:
a core;
buildup layers on the core;
first level interconnect (FLI) pads on a topmost buildup layer, wherein the FLI pads have a pitch; and
a plurality of vertically oriented planes embedded in the core, wherein individual ones of the plurality of vertically oriented planes are spaced at the pitch, and wherein one or more of the plurality of vertically oriented planes have a horizontal length extending an entirety of a horizontal length of the core; and
a die coupled to the package substrate by the FLI pads.

23. The electronic system of claim 22, wherein the core is a glass core.

24. The electronic system of claim 22, wherein cross-sections of individual ones of the plurality of vertically oriented planes are hourglass shaped.

25. The electronic system of claim 22, wherein the pitch is approximately 50 µm or smaller.

* * * * *